United States Patent [19]
Kuribayashi et al.

[11] Patent Number: 6,023,481
[45] Date of Patent: Feb. 8, 2000

[54] MODULE HAVING PELTIER ELEMENT

[75] Inventors: Masaki Kuribayashi; Tetsuo Ishizuka; Katsuhiko Kawasaki; Shuuichi Matsuura, all of Sapporo, Japan

[73] Assignee: Fujitsu Limited, Kawasaki, Japan

[21] Appl. No.: 09/003,873

[22] Filed: Jan. 7, 1998

[30] Foreign Application Priority Data

Oct. 15, 1997 [JP] Japan .................................. 9-281927

[51] Int. Cl.[7] ...................................................... H01S 3/04
[52] U.S. Cl. .................... 372/34; 372/36; 372/38
[58] Field of Search .................... 372/29, 34, 43, 372/38, 36, 50

[56] References Cited

U.S. PATENT DOCUMENTS

| | | | |
|---|---|---|---|
| 4,712,218 | 12/1987 | Ohnuki et al. | 372/38 |
| 5,065,226 | 11/1991 | Kluitmans et al. | 372/36 |
| 5,197,076 | 3/1993 | Davis et al. | 372/34 |
| 5,703,893 | 12/1997 | Komiyama et al. | 372/43 |
| 5,875,204 | 2/1999 | Sato | 372/34 |

*Primary Examiner*—Brian Healy
*Attorney, Agent, or Firm*—Armstrong, Westerman Hattori, McLeland & Naughton

[57] ABSTRACT

A module includes an element having a temperature response, a Peltier element thermally coupled to the element having the temperature response, and a capacitance component electrically coupled to the Peltier element.

13 Claims, 6 Drawing Sheets

MODULE HAVING PELTIER ELEMENT

BACKGROUND OF THE INVENTION

1. Field of the Invention

The present invention relates to a module having a Peltier element.

The Peltier element is thermally coupled with an element having a temperature response and is used to keep the element at a fixed temperature and stabilize the operation thereof. For example, the Peltier element is thermally coupled with a semiconductor laser diode, which is thus capable of emitting a constant light output irrespective of temperature variations. Generally, an element having a temperature response and a Peltier element are formed in a module formation in which the above elements are accommodated in a package.

2. Description of the Related Art

Figure 1:
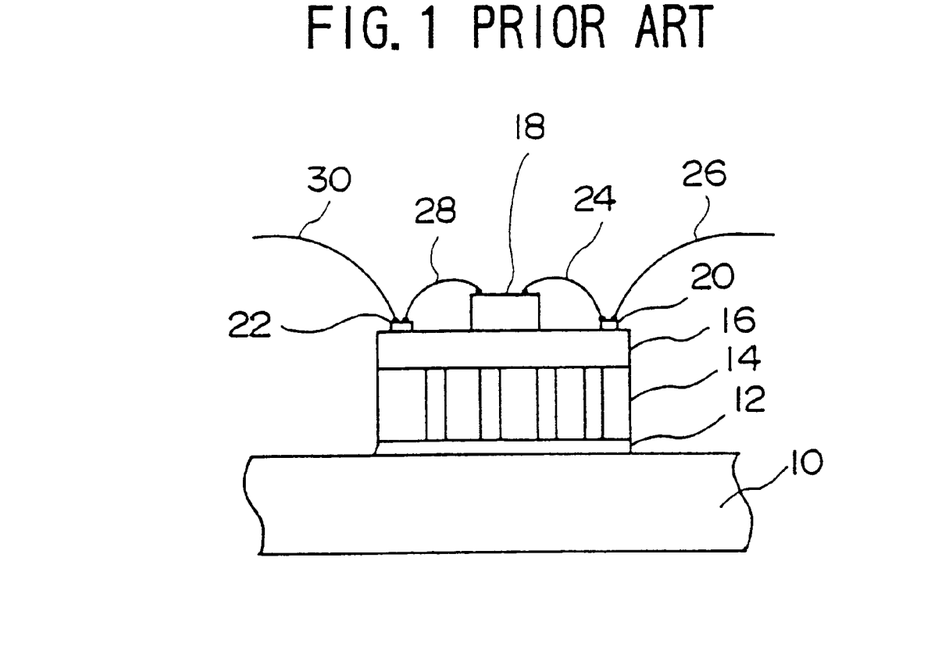
FIG. 1 is a cross-sectional view of a conventional laser diode module having a Peltier element.

FIG. 1 is a cross-sectional view of a conventional laser diode module, which has a package 10 made of an insulating member such as a ceramic member. A Peltier element 14 is fixed to the package 10 through a soldering layer 12 A carrier 16 is soldered to the top of the Peltier element 14. A laser diode 18 is fixed to the top of the Peltier element 14 by soldering of the like. A plurality of pads 20 and 22 for wire bonding are provided on the carrier 16. Terminals of the laser diode 18 are electrically connected to the pads 20 and 22 by bonding wires 24 and 28. The pads 20 and 22 are electrically connected to external connection terminals (not shown) supported by the package 10 by bonding wires 26 and 30, which are also grounded.

Figure 2:
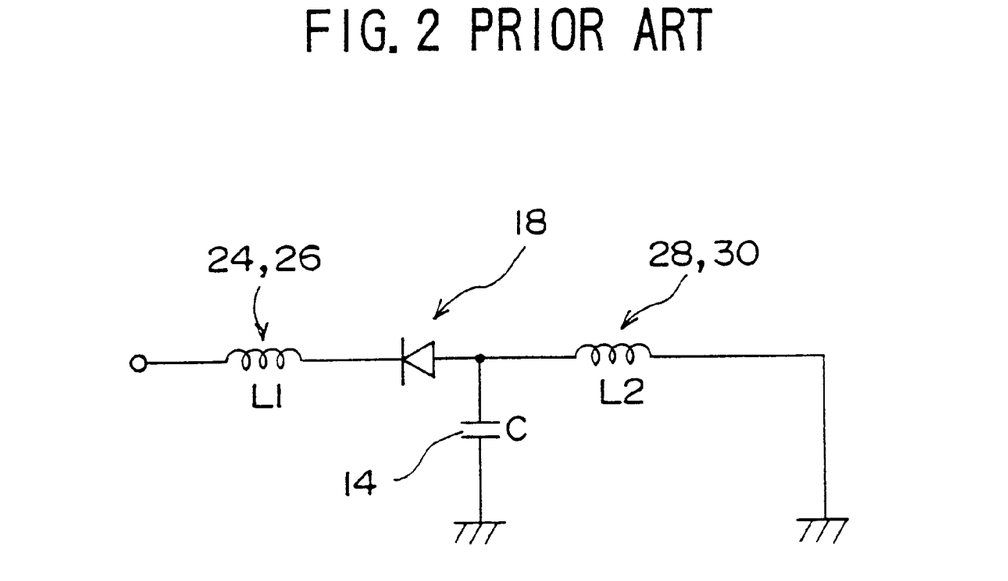
FIG. 2 is an equivalent circuit diagram of the module shown in FIG. 1.

FIG. 2 is an equivalent circuit of the laser diode module shown in FIG. 1. An inductance component L1 of the bonding wires 28 and 30 is connected to a cathode of the laser diode 18, and an inductance component L2 of the bonding wires 24 and 26 is connected to an anode thereof. A capacitance C of the Peltier element 14 is present between the anode of the laser diode 18 and the ground. The laser diode 18 is directly or indirectly modulated in accordance with data to be transmitted.

Figure 3:
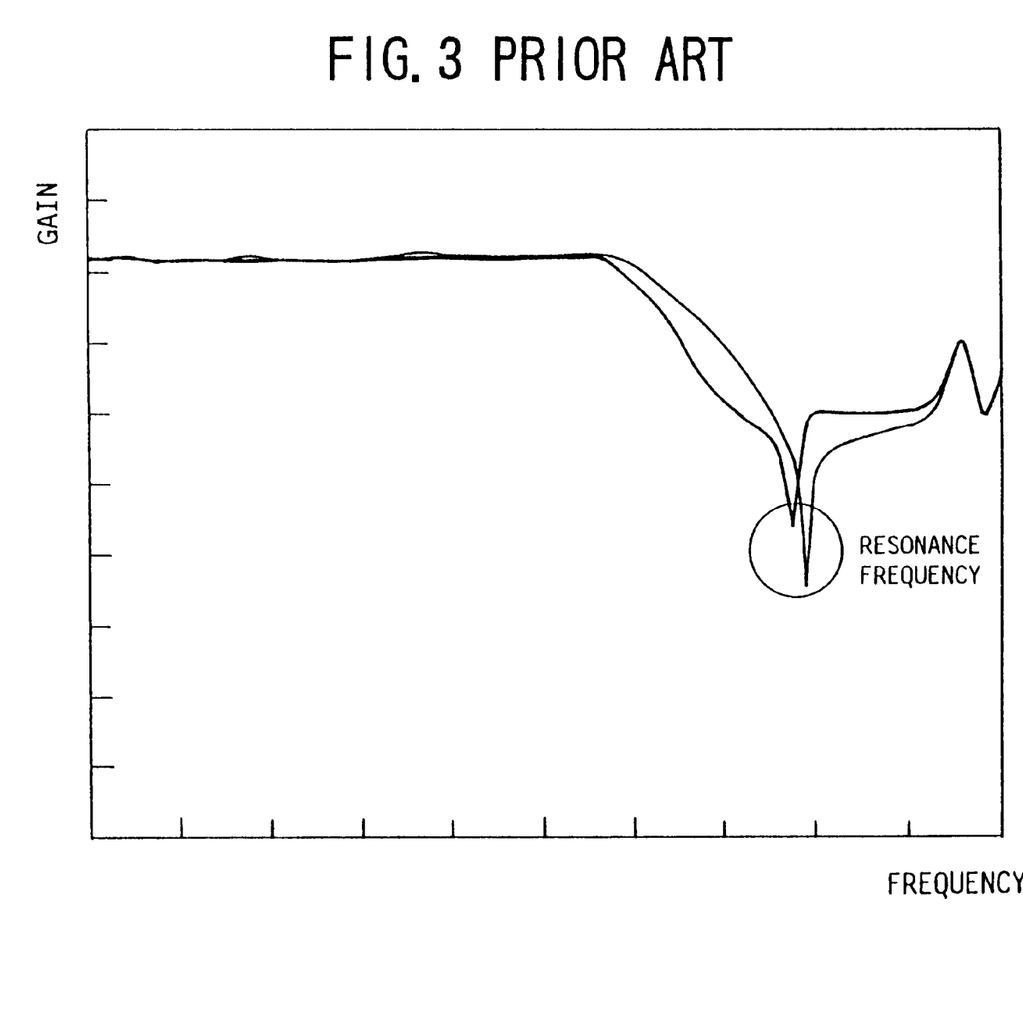
FIG. 3 is a graph of the frequency characteristic of the module shown in FIG. 1.

However, the conventional module having the Peltier element shown in FIG. 1 has problems due to the presence of the capacitance C of the Peltier element 14. More particularly, a series resonance circuit is formed by the capacitance C of the Peltier element 14 and the inductance L1 of the bonding wires 24 and 26, and affects the frequency response of the laser diode 18. For example, as shown in FIG. 3, a resonance point exists in the usable frequency band of the laser diode 18, and deteriorate the waveform of a driving signal applied to the laser diode 18. For example, the driving signal may have an overshoot or undershoot portion. Hence, a light signal emitted by the laser diode 18 is deformed, so that the optical transmission characteristic will be degraded.

SUMMARY OF THE INVENTION

It is a general object of the present invention to provide a module having a Peltier element in which the above problems are eliminated.

A more specific object of the present invention is to provide a module having a Peltier element having an improved frequency characteristic.

These objects of the present invention are achieved by a module comprising: an element having a temperature response; a Peltier element thermally coupled to the element having the temperature response; and a capacitance component electrically coupled to the Peltier element.

The module may be configured so that the capacitance component has a value which places a resonance frequency outside of a frequency band of the element having the temperature response, the resonance frequency depending on a capacitance component of the Peltier element, the capacitance component and an inductance component coupled to the Peltier element.

The module may be configured so that the element having the temperature response includes a laser diode.

The above objects of the present invention are also achieved by a module comprising: a package; a Peltier element supported by the package; and an element having a temperature response and thermally coupled with the Peltier element, the package comprising a capacitance component electrically coupled to the Peltier element.

The module may be configured so that: the package comprises a multilayer structure which supports the Peltier element; and the capacitance component comprises at least one electrically conductive layer formed in the multilayer structure.

The module may be configured so that the multilayer structure comprises a plurality of layers arranged in a stacked formation so that gaps are formed between the layers.

The module may be configured so that the electrically conductive layer has a portion which can be trimmed.

The module may be configured so that the package is formed of a ceramic material.

The module may be configured so that the element having the temperature response includes a laser diode.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4:
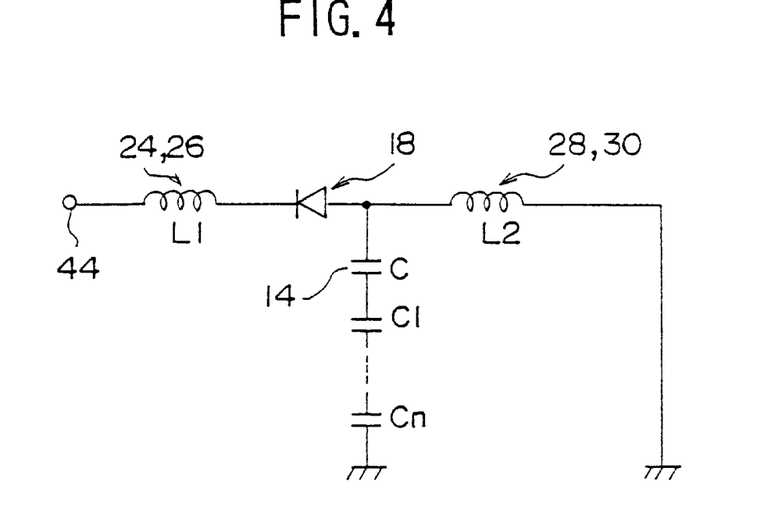
FIG. 4 is an equivalent circuit showing the principle of the present invention.

FIG. 4 is an equivalent circuit diagram showing the principle of the present invention. In FIG. 4, parts that are the same as those shown in the previously described figured are given the same reference numbers. As shown in FIG. 4, one or a plurality of capacitance components C1 through Cn (n is an integer) are connected in series to the capacitance component C of the Peltier element 14 so that a series circuit made up of the capacitance components C and C1 through Cn is connected between the anode of the laser diode 18 and the ground (more particularly, the upper surface of the Peltier element 14 and the ground). With the use of one or more capacitance components C1 through Cn, it becomes possible to reduce the capacitance component which exists between the Peltier element (more particularly, the upper surface thereof) and the ground. This is because one or more capacitance components C1 through Cn are connected in series to the capacitance component C of the Peltier element 18. A reduced capacitance functions to shift the resonance point of the series resonance circuit to a higher frequency, which is preferably placed outside of the usable frequency range. Hence, the usable frequency range of the laser diode 18 does not have any resonance point, so that an improved frequency characteristic of the laser diode 18 can be obtained.

Figure 5:
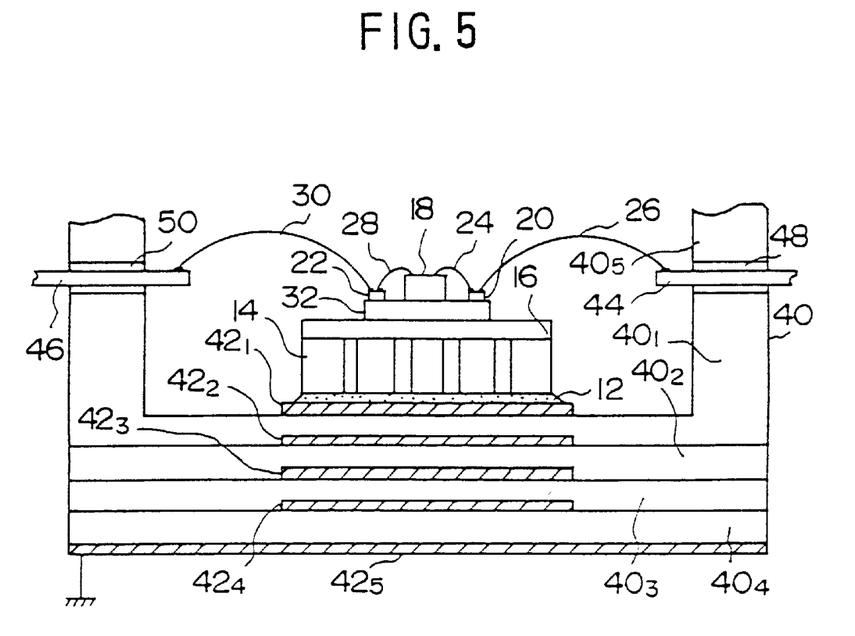
FIG. 5 is a cross-sectional view of a module according to an embodiment of the present invention.

FIG. 5 is a cross-sectional view of a laser diode module according to an embodiment of the present invention. In FIG. 5, parts that are the same as those shown in the previously described figures are given the same reference numbers.

Referring to FIG. 5, a package 40 is made of an insulating member such as a ceramic substance, and has a multilayer structure. An example of the ceramic substance is alumina ($Al_2O_3$). The package 40 has layers $40_1$, $40_2$, $40_3$, $40_4$ and $50_5$. The layer $40_1$ has a bottom portion which supports the Peltier element 14, and a sidewall portion which surrounds the Peltier element 14 and the laser diode 18. The layers $40_1$ through $40_4$ are stacked as shown in FIG. 5, and electrically conductive patterns $42_1$ through $42_4$ are provided on the respective upper surfaces of the layers $40_1$ through $40_4$. The conductive patterns $40_1$ through $40_4$ have an identical size, which is the same as or slightly greater than the size of the bottom surface of the Peltier element 14. An electrically conductive pattern $42_5$ functioning as a ground pattern is provided on the bottom surface of the layer $40_4$. The conductive patterns $42_1$ through $42_5$ are formed of an electrically conductive substance such as gold and tungsten, and are provided on the corresponding surfaces by a layer plating process or the like.

The conductive patterns $42_1$ through $42_5$ form the capacitance components C1 through Cn shown in FIG. 4. In the structure shown in FIG. 5, n is equal to 4, and the capacitance components C1 through C4 are connected in series to the capacitance component C of the Peltier element 14. More particularly, the conductive patterns $42_1$ through $42_5$ correspond to the electrodes of the capacitances C1 through Cn. Hence, it can be said that each capacitance is made up of two conductive patterns (electrodes) and the ceramic layer located therebetween. At least one capacitance is provided between the capacitance C of the Peltier element 14 and the ground by using the bottom portion of the package 40, so that a reduced capacitance can be obtained between the Peltier element 14 and the ground and the resonance frequency can be changed (increased).

The magnitude of the capacitance to be connected in series to the capacitance C of the Peltier element 14 depends on not only the number of capacitance components C1 through Cn (in other words, the number of layers $40_1$–$40_4$ and the number of conductive patterns $42_1$–$42_5$) but also the area of the conductive patterns $42_1$–$42_5$, the thicknesses substance of the layers $40_1$–$40_5$ and the dielectric constant of the material forming the layers $40_1$–$40_5$. The capacitance is proportional to the size of the electrodes and the dielectric constant of a substance placed between the electrodes and is inversely proportional to the distance between the two electrodes.

The following conditions will now be assumed:
(1) the capacitance C of Peltier element 14:3 pF
(2) the bottom surface of Peltier element 14:7 mm square
(3) ceramics: alumina ($k\epsilon=8.5$, $\epsilon=\epsilon_0 \times k_\epsilon = 7.5\times10^{-11}$ F/m) where $k_\epsilon$ is the relative dielectric constant of alumina and $\epsilon$ is the dielectric constant thereof
(4) the number of ceramic layers arranged in a stacked formation: 2($40_1$, $40_2$)
(5) the thickness d of ceramic layer: 0.5 mm
(6) the area of conductive patterns $42_1$ and $42_2$:10 mm square
(7) inductance L1: 0.5 nH.

The resonance frequency f obtained when only the capacitance C of the Peltier element 14 exists is as follows:

$$f = 1 / \left(2\pi\sqrt{L1C}\right)$$
$$= 1 / \left(2\pi\sqrt{0.5\times10^{-6}\times3\times10^{-12}}\right)$$
$$\approx 4.1 \text{ GHz.}$$

The resonance frequency fc obtained when a capacitance provided by the two ceramic layers $40_1$ and $40_2$ is connected in series to the capacitance C of the Peltier element 14 is obtained as follows. The two capacitances C1 and C2 respectively including the ceramic layers $40_1$ and $40_2$ is as follows:

$$C1 = C2 = \varepsilon \times S / d$$
$$= (7.5\times3\times10^{-11}\times10^{-4})/(5\times10^{-4})$$
$$= 15 \text{ pF.}$$

Hence, a composite capacitance Ct of the capacitances C1 and C2 is obtained as follows:

$$1/Ct = 1/C + 1/C1 + 1/C2$$
$$= 1/3 + 1/15 + 1/15.$$

Hence, Ct=2 pF. Thus, the resonance frequency fc is approximately equal to 5 GHz. Hence, the resonance frequency fc obtained by the present invention is approximately 0.9 GHz higher than the resonance frequency obtained by the conventional module. Hence, even if the laser diode module has a usable frequency range of 5 GHz, the module of the present invention is not affected by the resonance frequency fc, while the prior art module is affected by the resonance frequency f.

As described above, the capacitance value to be connected in series to the capacitance C of the Peltier element 14 is determined so that the resultant resonance frequency is located outside of the usable or used frequency band and is dependent on the number of stacked layers $40_1$–$40_5$, the area of the conductive patterns $42_1$–$42_5$, the thickness of the layers $40_1$–$40_5$ and the dielectric constant of the material forming the layers $40_1$–$40_5$.

A description will now be given of variants of the structure shown in FIG. 5.

The number of layers $40_1$–$40_5$ arranged in the stacked formation below the Peltier element 14 are not limited to four, but an arbitrary number of layers can be stacked. In this regard, it should be considered that the number of stacked layers is related to the heat radiating efficiency of the Peltier element 14. As an increased number of stacked layers is used, an increased amount of heat from the Peltier element 14 is stored therein, and the heat radiating efficiency deteriorates.

The package 40 can be formed of an insulating material other than ceramics. The size of the conductive patterns $42_1$–$42_4$ may be smaller than the size of the bottom portion of the Peltier element 14. However, if the size of the conductive patterns $42_1$–$42_4$ is extremely small, a desired resonance frequency may not be obtained effectively and efficiently. Each of the conductor patterns $42_1$–$42_4$ is provided to the respective ceramic layers $40_1$–$40_5$. Alternatively, the conductive patterns can be provided to only some ceramic layers.

The element temperature-regulated by the Peltier element 14 is not limited to the laser diode 18, and the present invention includes another element controllable by the Peltier element. The laser diode 18 may be of a direction modulation type or an external modulation type in which an external modulator of a semiconductor type or the like is used in cooperation with the laser diode.

Turning to FIG. 5 again, the carrier 16 is provided on the Peltier element 14, and a chip carrier 32 is provided on the carrier 16. The laser diode 18 and the pads 20 and 22 are provided on the chip carrier 32, on which optical components can be provided. External connection terminals (lead frames) 44 and 46 are so as to penetrate through lateral through holes formed in the package 40 and are fixed thereto by a glass-system adhesive 48. A ceramic layer $40_5$ is provided on the upper portion of the package 40. It can be considered that the ceramic layer $40_5$ is a component of the package 40.

A description will now be given of a first variation of the structure shown in FIG. 5 by referring to FIGS. 6 and 7, in which parts that are the same as those shown in the previously described figures are given the same reference numerals. The first variation has an arrangement directed to easily adjusting the capacitance connected in series to the capacitance C of the Peltier element 14. As shown in FIG. 7, the conductive pattern $42_1$ has a pattern portion $42_{1a}$ for adjusting the capacitance. When a portion x of the capacitance adjustment pattern $42_{1a}$ is trimmed by a laser beam and an end portion y is disconnected therefrom, the area of the electrode of the capacitance is reduced and a reduced capacitance value can be obtained.

The capacitance adjustment pattern $42_{1a}$ is not limited to the pattern shown in FIG. 7, and an arbitrary pattern can be employed. In order to make it possible to adjust the size of the electrode or electrodes of the capacitance after the Peltier element 14 is mounted, an arrangement shown in FIG. 6 is employed in which the conductive pattern $42_1$ has a size greater than the bottom portion of the Peltier element 14 so that the conductive pattern $42_1$ has an exposed portion extending from the Peltier element 14. The exposed portion can have an arbitrary shape.

When the conductive pattern $42_1$ has a size greater than the Peltier element 14, it is preferable that the other conductive patterns have almost the same size as that of the conductive pattern $42_1$. However, it is not required that the conductive patterns $42_2$–$42_4$ have the same pattern as that of the conductive pattern $42_1$. For example, the conductive patterns $42_2$–$42_4$ have a solid pattern.

Figure 8:
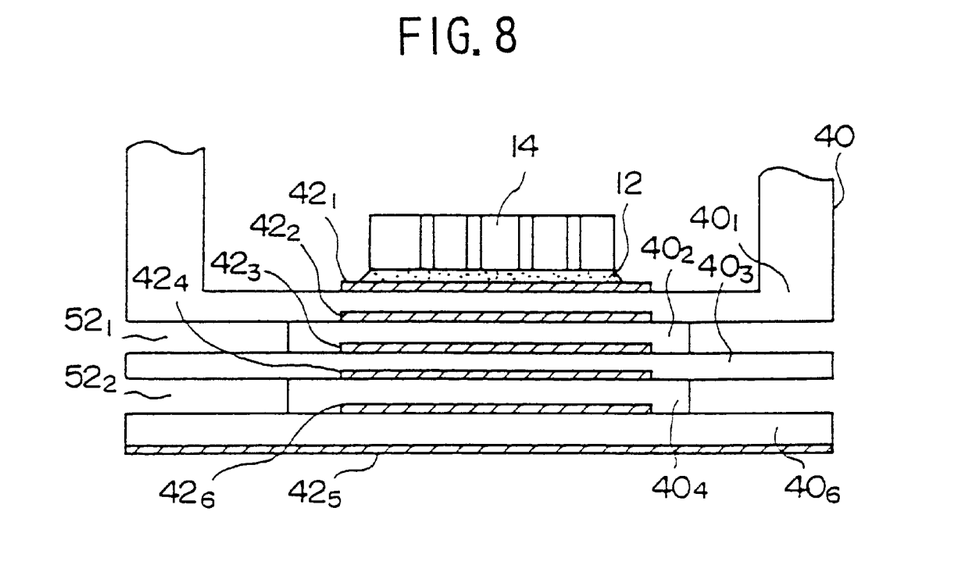
FIG. 8 is a cross-sectional view of a second variation of the structure shown in FIG. 5.

FIG. 8 is a cross-sectional view of a second variation of the structure shown in FIG. 5. In FIG. 8, parts that are the same as those shown in the previously described figures are given the same reference numbers. The second variation shown in FIG. 8 has an arrangement directed to improving the heat radiating efficiency of the Peltier element 14. The ceramic layers $40_2$ and $40_4$ are smaller than the other layers $40_1$, $40_3$ and $40_5$ so that gaps or spaces $52_1$ and $52_2$ can be defined. The gaps $52_1$ and $52_2$ make step portions, which contribute to increasing the surface area of the multilayer structure.

Figure 6:
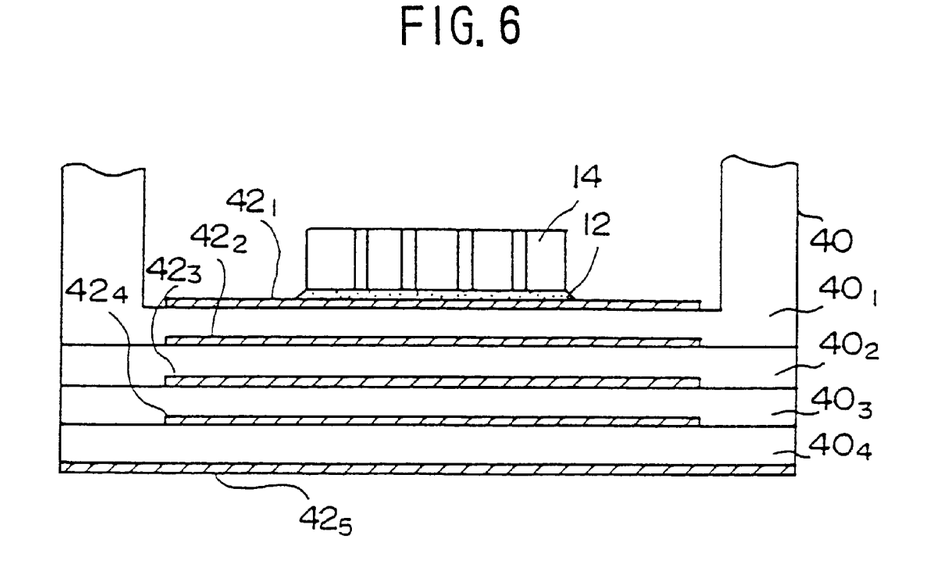
FIG. 6 is a cross-sectional view of a first variation of the structure shown in FIG. 5.
Figure 7:
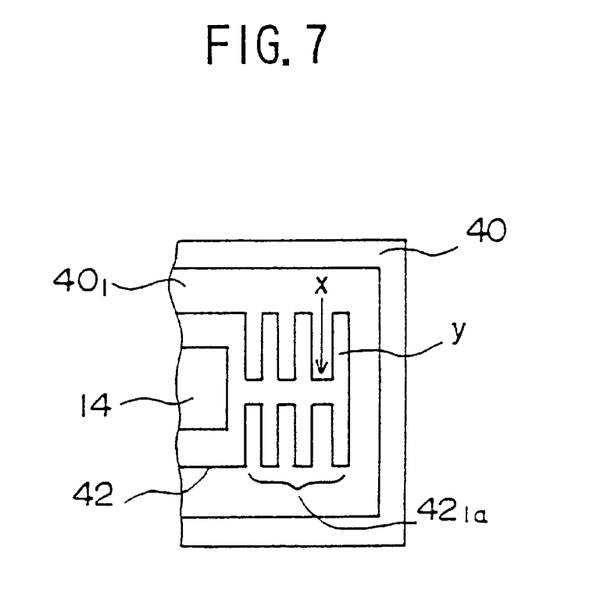
FIG. 7 is a plan view of a part of the first variation shown in FIG. 6.

The second variation shown in FIG. 8 can be applied to the first variation shown in FIG. 6. However, the structure shown in FIG. 6 will not have steps as large as those of the structure shown in FIG. 8 because the conductive patterns $42_1$–$42_4$ used in the first variation are larger than those used in the second variation.

Figure 9:
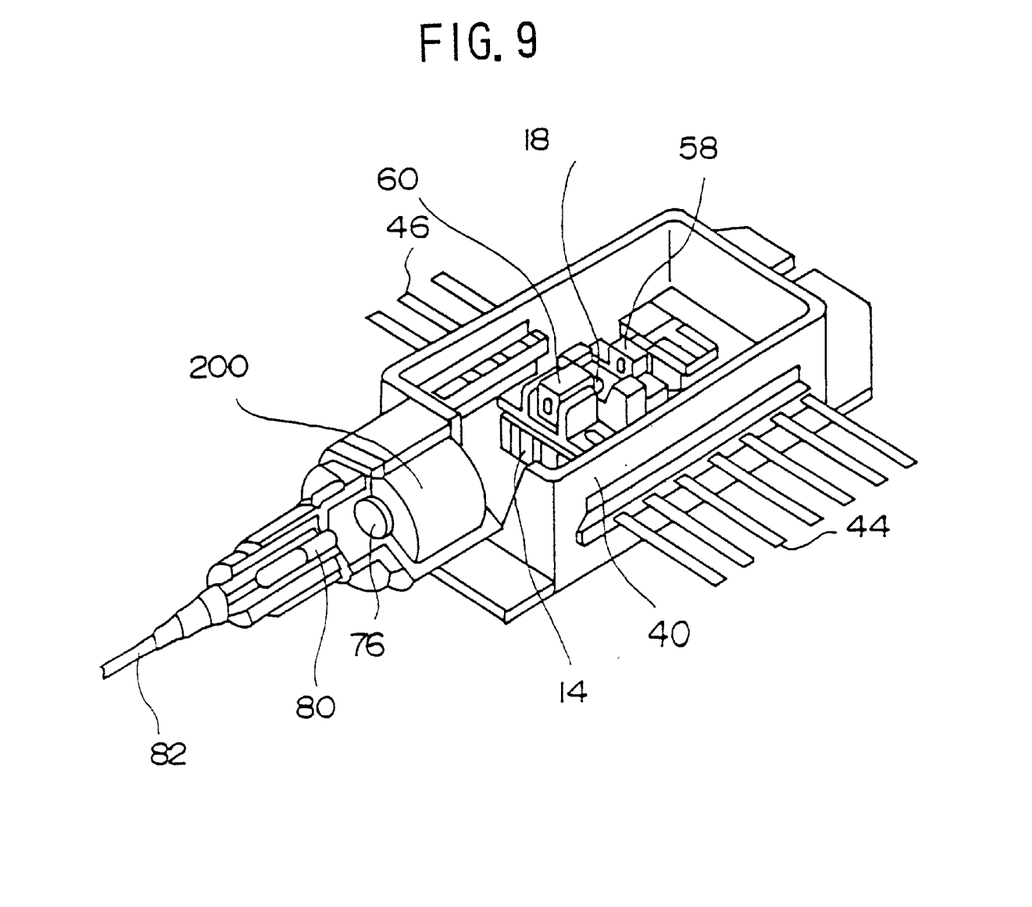
FIG. 9 is a perspective view of a layer diode module configured by the present invention.
Figure 10:
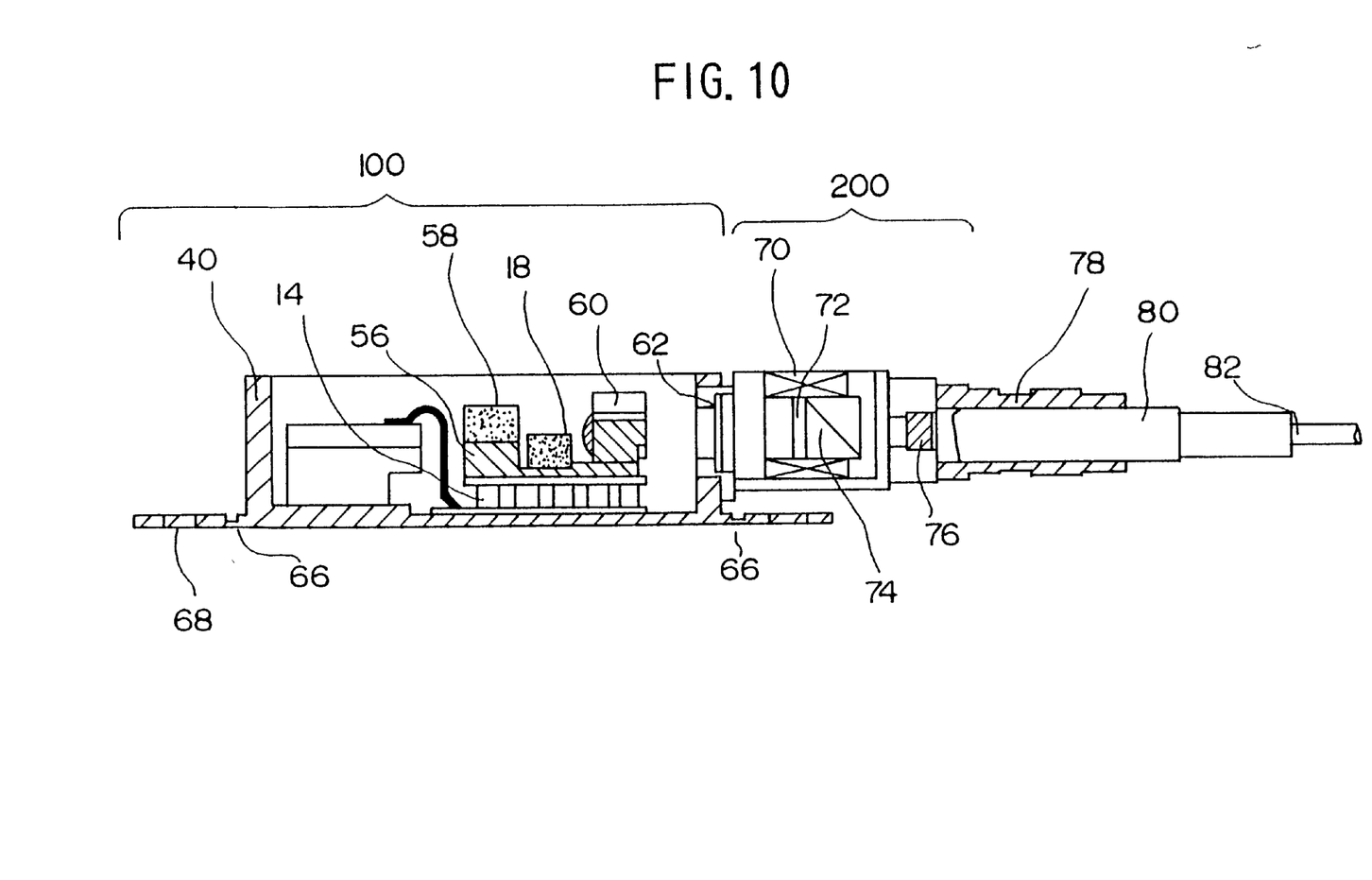
FIG. 10 is a cross-sectional view of the laser diode module shown in FIG. 9.

A description will now be given, with reference to FIGS. 9 and 10, of the overall structure of a laser diode module 100. In these figures, parts that are the same as those shown in the previously described figures are given the same reference numbers. The laser diode module 100 has the structure as described with reference to FIGS. 3 through 8. A base 56 of the laser diode module 100 corresponds to the aforementioned carriers 16 and 32. The laser diode module 100 is equipped with a photodiode (PD) 58, a first lens 60 and a sealed window 62. The photodiode 58 is used to monitor the light output by the laser diode 18. Terminals of the photodiode 58 are electrically connected to corresponding terminals among the external connection terminals 44 and 46 shown in FIG. 9 via bonding wires and pads provided on the base 56. The first lens 60 collects the output light of the laser diode 18. A package 40 has a flange portion in which a stress relaxing groove 66 is formed.

An isolator 200 is attached to the sealed window 62. The isolator 200 has a magnet 70, a rotator 72, an analyzer 74, and a second lens 76, and allows the light from the laser diode module 100 to pass therethrough and prevents light from an optical fiber 82 from passing therethrough. The first lens 60 and the second lens 76 can adjust a variation of the light output due to a thermal expansion of the Peltier element 14. A holder 78 is attached to the isolator 200, and the optical fiber 82 is attached thereto via a ferrule 80.

As has been described previously, the laser diode 18 shown in FIGS. 9 and 10 may be of the direct modulation type or external modulation type.

It is possible to use the capacitance to be connected in series to the capacitance C of the Peltier element 14 in order to reduce the resonance frequency of the resonance circuit whereby the resonance point is lower than the lowest frequency of the used frequency band. However, better electrical performance will be obtained by reducing the capacitance of the series resonance circuit.

The present invention is not limited to the specifically disclosed embodiments, and variations and modifications may be made without departing from the scope of the present invention.

What is claimed is:

1. A module comprising:
    an element having a temperature response;
    a Peltier element thermally coupled to the element having the temperature response; and
    a capacitance component electrically coupled to the Peltier element,
    wherein said capacitance is directly connected to said Peltier element.

2. The module as claimed in claim 1, wherein the capacitance component has a value which places a resonance frequency outside of a frequency band of the element having the temperature response, said resonance frequency depending on a capacitance component of the Peltier element, the capacitance component and an inductance component coupled to the Peltier element.

3. The module as claimed in claim 1, wherein the element having the temperature response includes a laser diode.

4. A module comprising:

a package;

a Peltier element supported by the package; and an element having a temperature response and thermally coupled with the Peltier element, wherein said package comprises a capacitance component electrically coupled to the Peltier element.

5. A module comprising:

a Peltier element:

a package supporting said Peltier element, said package comprising a capacitance component electrically coupled to the Peltier element; and an element having a temperature response and thermally coupled with the Peltier element, wherein said package comprises a multilayer structure which supports the Peltier element; and said capacitance component comprises at least one electrically conductive layer formed in the multilayer structure.

6. The module as claimed in claim 5, wherein the multilayer structure comprises a plurality of layers arranged in a stacked formation so that gaps are formed between the layers.

7. A module comprising:

a Peltier element;

a package supporting said Peltier element, said package comprising a capacitance component electrically coupled to the Peltier element; and an element having a temperature response and thermally coupled with the Peltier element, wherein the electrically conductive layer has a portion which can be trimmed.

8. The module as claimed in claim 5, wherein the electrically conductive layer has a portion which can be trimmed.

9. The module as claimed in claim 6, wherein the electrically conductive layer has a portion which can be trimmed.

10. The module as claimed in claim 4, wherein said package is formed of a ceramic material.

11. The module as claimed in claim 4, wherein the element having the temperature response includes a laser diode.

12. A module comprising:

an element having a temperature response;

a Peltier element thermally coupled to the element having the temperature response; and a capacitance component electrically coupled to the Peltier element, the Pelter element being grounded via the capacitance.

13. A module comprising:

an element having a temperature response;

a Peltier element thermally coupled to the element having the temperature response; and a plurality of capacitance components connected in series with each other and further connected in series with the Peltier element.

* * * * *

UNITED STATES PATENT AND TRADEMARK OFFICE
CERTIFICATE OF CORRECTION

PATENT NO.:   6,023,481
DATED     :   February 8, 2000
INVENTOR(S):  KURIBAYASHI et al.

It is certified that an error appears in the above-identified patent and that said Letters Patent is hereby corrected as shown below:

On the title page of the patent in item [75], change the second inventor, "Tetsuo Ishizuka" to be --Tetsuo Ishizaka--.

Signed and Sealed this

Thirteenth Day of February, 2001

*Attest:*

NICHOLAS P. GODICI

*Attesting Officer*  Acting Director of the United States Patent and Trademark Office